United States Patent [19]
Petitbon et al.

[11] Patent Number: 5,312,804
[45] Date of Patent: May 17, 1994

[54] METHOD OF FABRICATING A SUPERCONDUCTIVE FLEXIBLE CERAMIC CONDUCTOR HAVING A HIGH CRITICAL TEMPERATURE

[75] Inventors: Alain Petitbon, Saint Arnould Enyvelines; Roland Queriaud, Orsay, both of France

[73] Assignee: Alcatel Cable, Clichy Cedex, France

[21] Appl. No.: 967,425

[22] Filed: Oct. 28, 1992

[30] Foreign Application Priority Data

Oct. 29, 1991 [FR] France .................. 91 13313

[51] Int. Cl.$^5$ .................. B05D 3/06; B05D 5/12
[52] U.S. Cl. .................. 505/434; 505/730; 505/733; 505/740; 505/741; 505/742; 505/704; 505/325; 505/451; 427/62; 427/596; 427/453
[58] Field of Search .................. 505/1, 730, 741, 742, 505/740, 733, 704; 427/62, 63, 596, 453

[56] References Cited

U.S. PATENT DOCUMENTS 5,057,484 10/1991 Shiota et al. .

FOREIGN PATENT DOCUMENTS 01-246718 10/1989 Japan .
02-239102 9/1990 Japan .
2220426 1/1990 United Kingdom .

OTHER PUBLICATIONS

Akamatsu et al, "Instantaneous Preparation of Superconducting Thick Films Through Melts in the Bi-Ca-Sr-Cu-O System", Jpn. J. Appl. Phys. 27(9) Sep. 1988 L696-698.

Xu et al, "Highly Textured Thick Films by a Melt-Annealing Technique in the Bi-Sr-Ca-Cu-O System", Appl. Phys. Lett. 55(21) Nov. 1989 pp. 2236-2238.

Tachikawa et al, "High-Tc Superconducting Films of Y-Ba-Cu-Oxide Prepared by a Low Pressure Plasma Spraying", MRS, vol. 99, Nov. 1987 pp. 63-68.

Changsen et al, "The Effect of High Temperature Treatment of YBCO Powder on the Microstructure and Jc of YBCO/Ag/Ni Tapes", Supercond. Sci. Technol. 3(1990) pp. 587-590.

Patent Abstracts of Japan, vol. 13, No. 123 (E-733) Mar. 27, 1989 & JP-A-63 292 530 (Toshiba Corp.) Nov. 29, 1988.

Patent Abstracts of Japan, vol. 15, No. 3 (E-1019) Jan. 7, 1991 & JP-A-2 257 527 (Kokusai Chiyoudendou Sangyo Gijutsu Kenkyu Cente) Oct. 18, 1990.

*Primary Examiner*—Roy King
*Attorney, Agent, or Firm*—Sughrue, Mion, Zinn, Macpeak & Seas

[57] ABSTRACT

A method of fabricating a superconductive flexible conductor having a high critical temperature in which method a deposit of superconductive ceramic is applied to a metal tape of thickness lying in the range 0.1 mm to 1 mm, wherein:

the deposit of thickness lying in the range 50 µm to 300 µm and of concentration by volume of not less than 70% runs through an infrared beam at a speed of not less than 5 cm per minute, the zone treated by the the beam having a width of less than 10 mm relative to the travel direction and a surface temperature of not less than 1200° C., thereby imparting a surface superconductive layer to the deposit which is of concentration by volume close to 100%, which is textured in the travel direction, and which is of thickness lying in the range 10 µm to 100 µm; and annealing is then performed under oxygen.

13 Claims, 1 Drawing Sheet

METHOD OF FABRICATING A SUPERCONDUCTIVE FLEXIBLE CERAMIC CONDUCTOR HAVING A HIGH CRITICAL TEMPERATURE

The present invention relates to a method of fabricating a superconductive flexible conductor having a high critical temperature, i.e. based on a superconductive ceramic of the YBaCuO, BiSrCaCuO, TlBaCaCuO . . . type.

BACKGROUND OF THE INVENTION

Methods of making high critical temperature superconductors are known that comprise: starting from the superconductive oxide in powder form, making compacted sintered pellets therefrom, melting the surface of such pellets by means of a laser beam, rapidly cooling the molten layer, and then subjecting it to annealing. Such methods are described in the following articles:

"Concentration of current to the surface and modification by $CO_2$ laser for oxide superconductor", by H. Nomura et al.; 2nd International Symposium on Superconductivity, November 1989, Taukuba (pp. 423–426);

"The microstructure of superconductivity of $YBa_2Cu O_{7-x}$ rapidly solidified by a pulse laser" by J. C. Huang et al.; Supercond. Sci. Technol. 1, 1988 (pp. 110–112); and "Laser zone melting of $Bi_2Sr_2CaCuO_x$ superconductors" by K. Ishige et al.; 2nd International Symposium on Superconductivity, November, 1989, Taukuba (pp. 321–324).

The experimental parameters disclosed in those documents do not make it possible to obtain texturing with grains that are elongate in the same direction. In addition, all of the treatments described are performed on pellets having a thickness of greater than one millimeter; this is totally incompatible with making a flexible superconductor.

The essential difficulty is that a superconductive ceramic is a fragile material whose mechanical properties make it very difficult to fabricate in the form of a flexible conductor, particularly in long lengths.

To mitigate these problems of brittleness, attempts have been made to associate the ceramic with a metal support.

For example, metal-clad wires are made in monofilament or multifilament form. That method suffers from the drawback of requiring numerous mechanical forming steps, in particular wire-drawing steps, and intermediate annealing steps. Furthermore, there is a high risk of reaction between the ceramic and the cladding, and this can damage superconductivity given the very small diameter of the ceramic wire.

In another embodiment described in patent application JP-A-2 257 527, the ceramic is deposited as a very thin layer around a metal wire, by wetting the wire as it passes through a bath of Y-Ba-Cu-O type molten oxide. In order to ensure that the superconductive phase is formed on the wire on leaving the bath, the displacement speed must be very low, thereby giving rise to unacceptable reaction between the bath and the material of the wire.

A much more promising technique consists in depositing the ceramic in the form of a thick layer (several hundreds of microns thick) on a flexible metal tape.

Various methods have already been proposed for obtaining thick layers of superconductive ceramic: strip casting; silk-screen printing; calendering; electric arc spraying; and flame spraying. The resulting layers are porous to a greater or lesser extent, and they are crystallized to a greater or lesser extent depending on the method used. Thereafter they are annealed. Methods of that type and implementing plasmas are described in the following documents:

"High Tc superconducting films of YBaCu oxides prepared by low pressure plasma spraying" by K. Tachikawa et al.; Appl. Phys. Lett., 52 (12), 1988; and "Formation of YBaCuO thick films by plasma spraying" by Y. Wadayama et al.; 2nd International Symposium on Superconductivity, November, 1989, Tsukuba.

The maximum current densities obtained using those two methods are no more than 690 $A/cm^2$ and 1120 $A/cm^2$ respectively, and that is not enough.

Finally, proposals have been made in patent application JP-A-63 292530 and in French patent FR-A-2 647 266 for a method in which a precursor of superconductive material is placed in powder form on a substrate, and is then heated by a laser beam so as to make a layer that adheres to the substrate. Bonding can occur only if the laser beam acts throughout the thickness of the precursor powder, thereby likewise acting on the substrate, and this is particularly troublesome when the substrate is a flexible material that is a few tenths of a millimeter thick. In another variant, the powder is sprayed onto the substrate through the laser beam.

That technique does not achieve texturing of the superconductive layer, either. Furthermore, since the concentration by volume of the powder material as deposited on the substrate cannot exceed 30%, the densification that results from the laser treatment gives rise to very large stresses in said material, which stresses are released by cracking, thereby opposing the flow of current.

An object of the present invention is to implement a method of making a flexible superconductor, which method gives rise to a textured material capable of transporting current densities that are much greater than those of known flexible conductors.

SUMMARY OF THE INVENTION

The present invention provides a method of fabricating a superconductive flexible conductor having a high critical temperature in which method a deposit of superconductive ceramic is applied to a metal tape of thickness lying in the range 0.1 mm to 1 mm, wherein:

said deposit of thickness lying in the range 50 $\mu$m to 300 $\mu$m and of concentration by volume of not less than 70% runs through an infrared beam at a speed of not less than 5 cm per minute, the zone treated by the said beam having a width of less than 10 mm relative to the travel direction and a surface temperature of not less than 1200° C., thereby imparting a surface superconductive layer to said deposit which is of concentration by volume close to 100%, which is textured in the travel direction, and which is of thickness lying in the range 10 $\mu$m to 100 $\mu$m; and annealing is then performed under oxygen.

The present invention also provides a flexible conductor obtained by the above method.

Advantageously, said deposit is applied on said tape by strip casting, calendering, electric arc spraying, flame spraying, or laser spraying, and in the same fabricating operation, it is immediately followed by infrared treatment in accordance with the invention and by the above-specified annealing, in a continuous process. The mechanical stresses in the deposit are thus reduced. Laser spraying involves spraying a material as a powder in a laser beam.

Preferably:

said surface temperature lies in the range 1200° C. to 1500° C.;

the infrared beam is from a $CO_2$ laser pulsed at a frequency lying in the range 50 Hz to 1000 Hz and at a power lying in the range 100 $W/cm^2$ to 1000 $W/cm^2$, and advantageously in the range 400 $W/cm^2$ to 800 $W/cm^2$;

the thickness of said superconductive layer lies in the range 10 $\mu$m to 50 $\mu$m;

the thickness of said deposit lies in the range 100 $\mu$m to 200 $\mu$m; and the thickness of said metal tape lies in the range 0.1 mm and 0.5 mm; and it is made of a material selected from copper, silver, stainless steels, nickel-based superalloys, and cobalt-based superalloys.

By mastering the parameters of the method of the invention as defined above, it is possible to obtain temperature gradients on the surface of the deposit on the laser scanning axis that lie in the range 100° C. per millimeter to 1000° C. per millimeter, with cooling rates lying in the range 5000° C. per second to 10000° C. per second. Because of the surface melting speed of the deposit and the cooling speed of the molten layer, excessive heating of the tape-deposit interface and of the tape itself are avoided. This reduces the risk of the deposit becoming dissociated from the tape by reactions between the deposit and the tape and by the tape oxidizing.

In addition, the surface layer is dense and noncracked, and it has crystal orientation and texturing parallel to the laser scanning direction, in other words in the lengthwise direction of said tape.

The said annealing operation is essential for restoring the superconductive phase and for restoring oxygen. This operation comprises heating to a temperature lying in the range 850° C. to 950° C., a pause at said temperature for a period lying in the range 1 hour to 6 hours, and cooling at a rate lying in the range 10° C./hour to 100° C./hour, and preferably lying in the range 10° C./hour to 50° C./hour.

Operating conditions may be selected so that the critical current density reaches a value of about 100 $A/mm^2$, i.e. a value that is much greater than that of prior art superconductor tapes.

In a variant implementation, a sublayer may be provided on said tape in order to improve bonding of the deposit, and in particular to harmonize the expansion coefficients and to limit chemical interactions between the tape and the deposit during the heat treatments. For example, the sublayer may be of silver or of an alloy of the NiCrAlY, CoCrAlY, or NiAl type. Its thickness may lie in the range 10 $\mu$m to 200 $\mu$m, and preferably lies in the range 10 $\mu$m to 100 $\mu$m.

In addition, the composition of said deposit may either stoichiometric for the superconductive phase, or else it may be enriched with elements that are liable to vaporize during the laser treatment, e.g. copper.

BRIEF DESCRIPTION OF THE DRAWINGS

Embodiments of the invention are described by way of example with reference to the accompanying drawings, in which:

FIGS. 2A and 2B are respectively a plan view and a section view of a flexible metal tape of the invention after passing through the electric arc torches in the installation of FIG. 1.

FIG. 3 is a plan view of the FIG. 2A tape while it is passing through the laser beam.

FIG. 4 is a cross-section view through the FIG. 3 tape, limited to the zone where its surface has been textured by the laser beam.

FIG. 5 is a photograph (magnified $\times$ 100) of the surface of a superconductive layer without laser treatment of the invention.

FIG. 6 is a photograph of the surface of a superconductive layer of the invention ($\times$ 100).

FIG. 7 is a photograph of a zone of the FIG. 6 layer ($\times$ 750) showing its texturing in the laser scanning direction.

FIG. 8 is a graph showing critical current curves that correspond to the layers of FIG. 5 and of FIG. 6 respectively.

FIG. 9 is a graph showing critical temperature curves that correspond to the layers of FIG. 5 and of FIG. 6 respectively.

DETAILED DESCRIPTION

Figure 1:
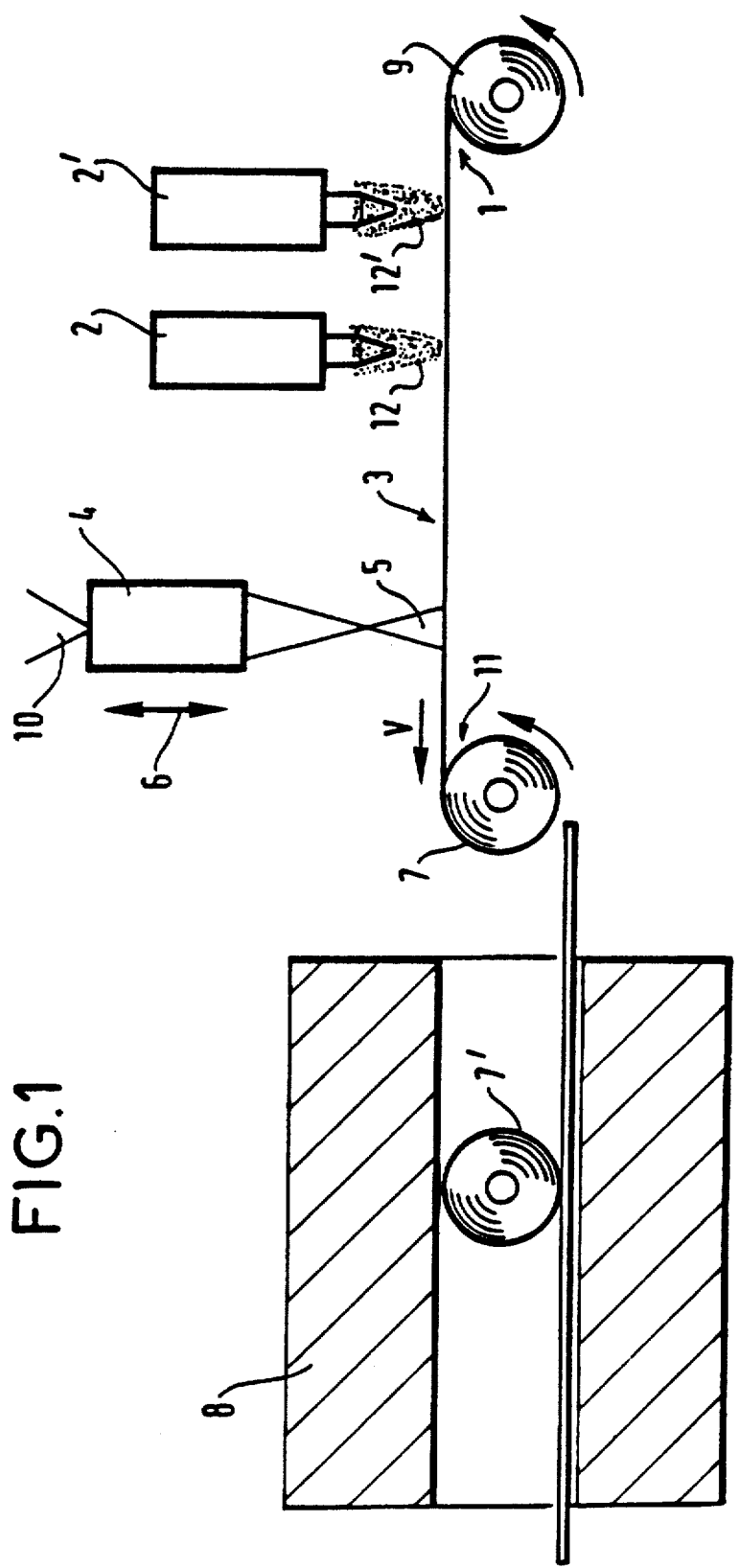
FIG. 1 is a highly diagrammatic view of an installation implementing the method of the invention on a continuous basis.

FIG. 1 is a diagram of an installation that implements the method of the invention on a continuous basis. A flexible metal tape 1 wound onto a spool 9 runs under an electric arc torch 2 which sprays a composition 12 of superconductive ceramic onto the tape 1 so as to provide a deposit whose thickness lies in the range 50 $\mu$m to 300 $\mu$m, and whose concentration by volume is greater than 70%, said torch 2 optionally being preceded by a torch 2' of the same type which previously sprays a material 12' for improving adhesion of the composition 12 on the metal tape 1. The flexible metal tape provided with its deposit is referenced 3. The tape 3 then runs at speed V beneath a beam 5 from an infrared laser 10 that is associated with a system 4 for homogenizing its beam. By adjusting the laser along the axis 6 orthogonal to the flexible tape 3, it is possible to adjust the diameter of the beam 5. A quick response bichromatic pyrometer (not shown) measures the surface temperature in the zone of the deposit 3 that is being treated by the beam 5.

The flexible conductor 11 treated in this way is then wound onto a reel 7 which is subsequently inserted (position 7') into an annealing oven 8, e.g. a tunnel oven.

FIGS. 2A and 2B show the flexible tape 3 after it has passed beneath the torches 2 and 2', showing the original metal tape, a sublayer 21, and a deposit 22 of superconductive ceramic.

FIG. 3 shows the track of the laser beam 5 on the deposit 22 as the flexible tape 3 runs past at speed V. A central treatment zone 20 is marked, as are two margins 26 that are scanned by the edges of the laser beam 5.

FIG. 4 is a cross-section showing the effect of said laser beam 5 in the central zone 20. This figure shows the sublayer 21 as before on the metal tape 1, but the ceramic deposit 22 has been considerably transformed by the laser treatment. There can be seen:

a reaction zone 23 between the sublayer 21 and the ceramic; this zone is not superconductive;

a zone 24 of ceramic that has not been treated by the laser beam 5 and which has retained the same structure as the deposit 22 per se; this zone is poorly conductive; and a surface layer 25 melted by the laser beam, which is dense, and which is textured in the travel direction of the tape 1.

It may be observed that the margins 26 on either side of the zone 25 are textured at substantially 45° relative to said layer 25.

EXAMPLE I

The starting material was a 10 mm wide and 0.3 mm thick NS225 stainless steel tape 1. The tape was provided with a 100 μm thick sublayer 21 of NiCrAlY alloy. A 100 μm thick deposit 22 of $YBa_2Cu_3O_x$ was formed using a plasma torch. A sample was taken and annealed for 6 hours at 900° C. under oxygen and then cooled at 20° C./hour.

The surface of the deposit 22 (FIG. 5) had numerous cracks. Silver contacts were formed on the resulting conductor in order to measure its critical current. FIG. 8 is a graph with voltage in microvolts plotted as a function of current I (amps). The result is curve B. The transport critical current is 2 amps (with 1 μvolt per centimeter) at 77 K, i.e. 4 amps per $mm^2$. FIG. 9 shows that the critical temperature of said conductor (curve D) is equal to 84 K.

According to the invention, the beam 5 from a $CO_2$ laser having a diameter of 5 mm with energy distribution that is uniform to within 10%, as monitored using a kaleidoscope, was applied to the deposit 22. The energy was 800 $W/cm^2$. The pulse frequency was 500 Hz and the scanning speed V was 20 cm/minute. The surface temperature as continuously monitored using a bichromatic pyrometer was 1500° C.

The thickness of the molten layer 25 was 40 μm. The same annealing was performed as for the above-described sample. The layer 25 shown in FIG. 6 has no cracks. Its concentration by volume is very close to 100%. Its highly characteristic texturing can be seen in FIG. 7. Its grains are elongate in the travel direction of the tape (arrow V).

As for the preceding sample, the critical current and the critical temperature of the resulting conductor were measured (see curve C in FIG. 8 and curve E in FIG. 9). The critical current measured at 77 K was 10 A, i.e. 50 $A/mm^2$, and the critical temperature was 88 K.

EXAMPLE II

The deposit 22 of Example I was slightly modified with respect to composition. A material 12 of the copper-enriched $Y_1Ba_2Cu_4O_x$ type was used. This makes it possible to compensate for the loss of a certain quantity of copper during the laser treatment.

The laser treatment was performed under the following conditions: the pulse frequency was 300 Hz, the energy was 600 $W/cm^2$, and the scanning speed was 5 cm/minute.

The surface temperature was 1300° C. and the thickness of the molten layer 25 was 40 μm. Annealing was identical to that of Example I. The measured critical current was 20 A, i.e. 100 $A/mm^2$.

EXAMPLE III

The deposit 22 was no longer 100 μm thick, but was 150 μm thick.

The laser treatment was performed under the following conditions: the pulse frequency was 500 Hz, the energy was 1000 $W/cm^2$, and the scanning speed was 30 cm/minute. The surface temperature was 1600° C. and the molten layer 25 was 100 μm thick. Annealing was identical to that of the preceding examples. The critical current was 5 A, i.e. 10 $A/mm^2$.

Naturally the present invention is not limited to the examples described above. The materials and the thicknesses of the various layers may be modified as mentioned above, in which case the laser treatment parameters are optimized as a function of said modifications. The sublayer 21 is not essential.

We claim:

1. A method of fabricating a superconductive flexible conductor having a high Tc comprising the steps of applying a deposit of a superconductive ceramic of a thickness of 50 μm to 300 μm and of a concentration by volume of not less than 70% to a metal tape of a thickness lying in the range of 0.1 mm to 1 mm, passing a central zone of said deposit having a width of less than 10 mm relative to a tape travel direction, through an infrared laser beam having a diameter less than said width of said deposit at a speed of not less than 5 cm per minute and causing a surface temperature to be heated to not less than 1200° C., thereby imparting to said deposit at said zone, a surface superconductive layer of a concentration by volume close to 100%, which is textured in the metal tape travel direction, and which is of a thickness lying in the range of 10 μm to 100 μm, which thickness is less than that of said deposit and annealing under oxygen said metal tape provided with said deposit and including said surface superconductive layer.

2. A method according to claim 1, wherein said deposit is applied to said metal tape by one continuous application step selected from the group consisting of: strip casting, calendering, electric arc spraying, flame spraying, and spraying said deposit as a powder in a laser beam, said applying step being directly followed by passing said central zone of said deposit through said infrared laser beam, and by said annealing step.

3. A method according to claim 1, wherein said surface temperature lies in the range 1200° C. to 1500° C.

4. A method according to claim 1, wherein the infrared laser beam heating step comprises pulsing a $CO_2$ laser at a frequency lying in the range from 50 Hz to 1000 Hz, at a power density lying in the range of 100 $W/cm^2$ to 1000 $W/cm^2$.

5. A method according to claim 4, wherein said laser pulsing step is effected at a laser power density which lies in the range of 400 $W/cm^2$ to 800 $W/cm^2$.

6. A method according to claim 1, wherein the thickness of said surface superconductive layer lies in the range 10 μm to 50 μm.

7. A method according to claim 1, wherein the thickness of said deposit lies in the range 100 μm to 200 μm.

8. A method according to claim 1, wherein the thickness of said metal tape lies in the range 0.1 mm to 0.5 mm.

9. A method according to claim 1, wherein said metal tape is one material selected from the group consisting of: copper, silver, stainless steels, nickel-based superalloys, and cobalt-based superalloys.

10. A method according to claim 9, wherein prior to making said deposit, said method further comprising applying to said metal tape a sublayer for improving adhesion of the deposit on the tape, said sublayer having a thickness lying in the range of 10 μm to 200 μm, and being of one material selected from the group consisting of: NiCrAlY, CoCrAlY, and an alloy of NiAl.

11. A method according to claim 1, wherein said step of annealing under oxygen comprises; heating said tape and said deposit to a temperature lying in the range of 850° C. to 950° C. pausing at said heating temperature for a time lying in the range of 1 hour to 6 hours, and cooling at a speed lying in the range of 10° C./hour to 100° C./hour.

12. A method according to claim 11, wherein said cooling speed lies in the range 10° C./hour to 50° C./hour.

13. A method according to claim 1, wherein the composition of said deposit is enriched with elements in order to compensate the loss of the elements in said deposit during said infrared laser beam applying step.

* * * * *